United States Patent
Gao et al.

(10) Patent No.: US 12,382,812 B2
(45) Date of Patent: Aug. 5, 2025

(54) DISPLAY PANEL AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Hongcheng Gao, Beijing (CN); Can Huang, Beijing (CN); Weilin Lai, Beijing (CN); Jiandong Bao, Beijing (CN); Jiwei Wang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 477 days.

(21) Appl. No.: 17/919,751

(22) PCT Filed: Aug. 4, 2021

(86) PCT No.: PCT/CN2021/110620
§ 371 (c)(1),
(2) Date: Oct. 19, 2022

(87) PCT Pub. No.: WO2022/068382
PCT Pub. Date: Apr. 7, 2022

(65) Prior Publication Data
US 2023/0209948 A1 Jun. 29, 2023

(30) Foreign Application Priority Data
Sep. 30, 2020 (CN) .......................... 202011063539.3

(51) Int. Cl.
*H10K 59/35* (2023.01)
*H10K 59/38* (2023.01)
*H10K 59/80* (2023.01)

(52) U.S. Cl.
CPC ........... *H10K 59/353* (2023.02); *H10K 59/38* (2023.02); *H10K 59/873* (2023.02)

(58) Field of Classification Search
CPC .... H10K 59/353; H10K 59/38; H10K 59/873; H10K 59/8792; H10K 59/351;
(Continued)

(56) References Cited

U.S. PATENT DOCUMENTS

2016/0181336 A1 6/2016 Tokuda et al.
2020/0041837 A1 2/2020 Jiang et al.
(Continued)

FOREIGN PATENT DOCUMENTS

| CN | 110045540 A | 7/2019 |
| CN | 110133919 A | 8/2019 |

(Continued)

OTHER PUBLICATIONS

International Search Report for PCT/CN2021/110620 Mailed Nov. 3, 2021.

*Primary Examiner* — Elmito Breval
(74) *Attorney, Agent, or Firm* — Ling Wu; Stephen Yang; Ling and Yang Intellectual Property

(57) ABSTRACT

A display panel (10), including a light-emitting device layer (11) and a color film layer (12) arranged on a light-emitting side of the light-emitting device layer (11), the light-emitting device layer (11) includes a plurality of light-emitting units (112); each light-emitting unit (112) includes one first sub-pixel (1122), one second sub-pixel (1124) and two third sub-pixels (1126); the color film layer (12) includes a black matrix (122) and a plurality of color film units (124) corresponding to the plurality of light-emitting units (112); each color film unit (124) includes a first color film (1242) corresponding to the one first sub-pixel (1122), a second color film (1244) corresponding to the one second sub-pixel (Continued)

(1124) and a third color film (1246) corresponding to the two third sub-pixels (1126); the black matrix (122) is located between any two of the first color film (1242).

20 Claims, 2 Drawing Sheets

(58) Field of Classification Search
CPC ...... H10K 59/352; H10K 59/30; H10K 50/85; H10K 50/86
See application file for complete search history.

(56) References Cited

U.S. PATENT DOCUMENTS

| | | |
|---|---|---|
| 2020/0212125 A1 | 7/2020 | Liu et al. |
| 2021/0202585 A1 | 7/2021 | Chen |

FOREIGN PATENT DOCUMENTS

| | | |
|---|---|---|
| CN | 111048569 A | 4/2020 |
| CN | 112103328 A | 12/2020 |

DISPLAY PANEL AND DISPLAY APPARATUS

CROSS-REFERENCE TO RELATED APPLICATIONS

The present application is a U.S. National Phase Entry of International Application No. PCT/CN2021/110620 having an international filing date of Aug. 4, 2021, which claims the priority and benefits of the patent application with the patent application number 202011063539.3 filed to the China National Intellectual Property Administration on Sep. 30, 2020. The above-identified applications are hereby incorporated by reference.

TECHNICAL FIELD

The present disclosure relates to the field of display technology, and in particular, to a display panel and a display apparatus.

BACKGROUND

Among related technologies, COE (Color Film on Encapsulation, i.e., the color film is manufactured on an encapsulation layer directly) technology, which uses color film (CF) instead of polarizer, can make the display screen have characteristics such as higher integration and lightness. Integrating filter function directly on the display backplane can significantly reduce the thickness of the display backplane and save a lot of production costs. However, because of the black matrix (BM) in COE products, the aperture diffraction is formed, which is easy to cause color separation and greatly limits the application scenarios of COE products. Therefore, how to effectively solve these problems has become one of the main directions of COE research.

SUMMARY

Embodiments of the present disclosure provide a display panel and a display apparatus.

The display panel of the embodiment of the present disclosure comprises a light emitting device layer and a color filter layer arranged on the light emitting side of the light emitting device layer; the light emitting device layer comprises a plurality of light emitting units arranged in an array, each light emitting unit comprises a first sub-pixel, a second sub-pixel and two third sub-pixels, the first sub-pixel, the second sub-pixel and the third sub-pixel have different sizes and shapes; and the color filter layer comprises a black matrix and a plurality of color film units corresponding to the plurality of light emitting units, each of the color film units includes a first color film, a second color film and a third color film arranged in a first direction, a black matrix is located between any two color films of the first color film, the second color film and the third color film, the first color film, the second color film and the third color film have the same shape and size, the first color film corresponds to one of the first sub-pixels, the second color film corresponds to one of the second sub-pixels, and the third color film corresponds to two of the third sub-pixels.

In some embodiments, the minimum distance between the side of the first color film extending along a second direction and the side of the corresponding first sub-pixel extending along the second direction is smaller than the minimum distance between the sides of the first color film extending along other directions and the sides of the corresponding first sub-pixel extending along other directions.

In some embodiments, the ratio of the minimum distance between the side of the first color film extending along the second direction and the side of the corresponding first sub-pixel extending along the second direction and the minimum distance between the sides of the first color film extending along other directions and the sides of the corresponding first sub-pixel extending along other directions is 1:3 to 1:2.

In some embodiments, the minimum distance between the side of the second color film extending along the second direction and the side of the corresponding second sub-pixel extending along the second direction is larger than the minimum distance between the sides of the second color film extending along other directions and the sides of the corresponding second sub-pixel extending along other directions.

In some embodiments, the ratio of the minimum distance between the side of the second color film extending along the second direction and the side of the corresponding second sub-pixel extending along the second direction and the minimum distance between the sides of the second color film extending along other directions and the sides of the corresponding second sub-pixel extending along other directions is 3:1 to 4:1.

In some embodiments, the minimum distance between the side of the third color film extending along the second direction and the side of the corresponding third sub-pixel extending along the second direction is larger than the minimum distance between the sides of the third color film extending along other directions and the sides of the corresponding third sub-pixel extending along other directions.

In some embodiments, the ratio of the minimum distance between the side of the third color film extending along the second direction and the side of the corresponding third sub-pixel extending along the second direction and the minimum distance between the sides of the third color film extending along other directions and the sides of the corresponding third sub-pixel extending along other directions is 1.5:1 to 2.5:1.

In some embodiments, the light emitting color of the first sub-pixel is the same as the color of the first color film, the light emitting color of the second sub-pixel is the same as the color of the second color film, and the light emitting color of the third sub-pixel is the same as the color of the third color film.

In some embodiments, the first sub-pixel is a blue sub-pixel, the second sub-pixel is a red sub-pixel, and the third sub-pixel is a green sub-pixel.

In some embodiments, a transverse dimension of the blue sub-pixel in the first direction is larger than a transverse dimension of the red sub-pixel in the first direction.

In some embodiments, a connecting line connecting centers of the two third sub-pixels is perpendicular to the first direction.

In some embodiments, the blue sub-pixel is hexagonal, the red sub-pixel is hexagonal, and the green sub-pixel is pentagonal.

In some embodiments, the display panel includes a switching device layer located on a side of the light emitting device layer away from the color filter layer.

In some embodiments, the display panel comprises an encapsulation layer located between the light emitting device layer and the color filter layer.

In some embodiments, the display panel includes a protection layer located on a side of the color filter layer away from the light emitting device layer.

The present disclosure further provides a display apparatus, and the electronic apparatus comprises the display panel of any one of the above embodiments.

In the display panel and display apparatus of the present disclosure, a first color film, a second color film and a third color film with basically the same size and shape are arranged corresponding to corresponding sub-pixels. For sub-pixels with different areas, the size of the color film corresponding to each sub-pixel is designed to match with the sub-pixel, so as to improve the reduction of luminescence of each sub-pixel in different directions and reduce the phenomenon of color separation. At the same time, a third sub-pixel is provided in correspondence to a third color film. Compared with the one-to-one color film scheme, the process difficulty of the black matrix between the color films corresponding to the third sub-pixel is reduced, and the probability of alignment, residue, peeling and other problems of the black matrix is reduced.

Additional aspects and advantages of the embodiments of the present disclosure will be partially shown or become apparent in the following description, or will be learned from practice of the embodiments of the present disclosure.

BRIEF DESCRIPTION OF DRAWINGS

The above mentioned and/or additional aspects and advantages of the present disclosure will become apparent and easy to understand from the following description of embodiments in conjunction with accompanying drawings.

Figure 1:
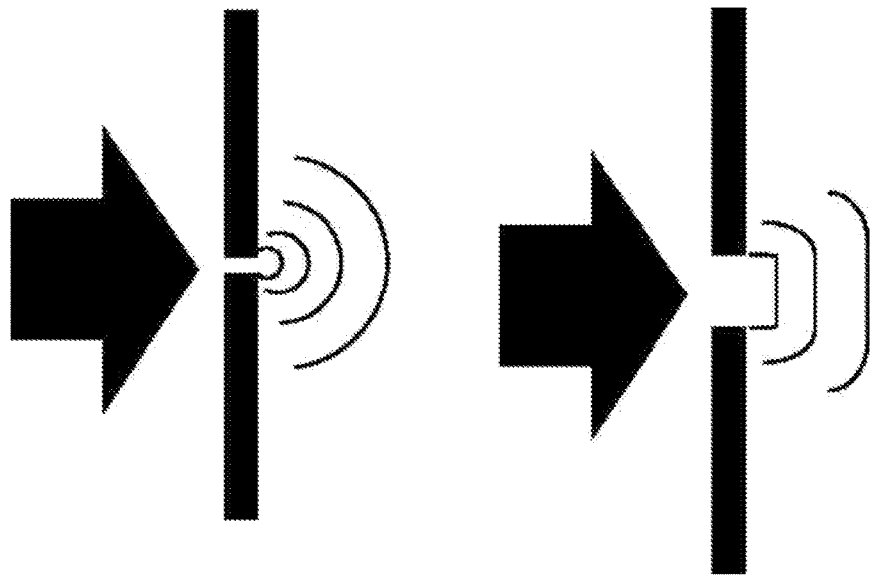
FIG. 1 is a schematic diagram of the light diffraction of an embodiment of the present disclosure.

DESCRIPTION OF MAIN COMPONENT SYMBOLS display apparatus 100, display panel 10, light emitting device layer 11, light emitting unit 112, first sub-pixel 1122, second sub-pixel 1124, third sub-pixel 1126, color film layer 12, black matrix 122, color film unit 124, first color film 1242, second color film 1244, third color film 1246, switching device layer 13, encapsulation layer 14, first chemical vapor deposition layer 142, inkjet printing layer 144, second chemical vapor deposition layer 146, planarization layer 15, and protection layer 16.

DETAILED DESCRIPTION

Descriptions will now be made in detail to embodiments, illustrations of which are shown in the accompanying drawings. The same or similar, or functionally same or similar elements are indicated by same or similar reference numerals throughout the descriptions. The embodiments described herein with reference to the accompanying drawings are exemplary, used for explaining the present disclosure only, and should not be construed to limit the present disclosure.

In the description of embodiments of the present disclosure, it should be understood that orientation or position relationships indicated by terms "center", "longitudinal", "transverse", "length", "width", "thickness", "upper", "lower", "front", "back", "left", "right", "vertical", "horizontal", "top", "bottom", "inside", "outside", "clockwise", "counterclockwise" and the like are based on the orientation or position relationships shown in the drawings, and are for the convenience of description of the present disclosure and simplification of the description only, but are not intended to indicate or imply that the mentioned device or element must have a specific orientation, or be constructed and operated in a particular orientation, and therefore they should not be construed as limitation on the present disclosure. In addition, the terms "first" and "second" are used for descriptive purposes only and cannot be interpreted as indicating or implying relative importance or implicitly indicating the number of technical features indicated. Therefore, a feature defined by "first" and "second" may explicitly or implicitly indicates inclusion of one or more such features. In the description of the present disclosure, the meaning of "a plurality of" is two or more than two, unless defined otherwise explicitly.

The following disclosure provides many different embodiments or examples for implementing different structures of the present disclosure. In order to simplify the disclosure of the present disclosure, components and arrangements of specific examples are described as follows. Of course, they are only by way of example and are not intended to limit the present disclosure. Further, the present disclosure may repeat reference numbers and/or reference letters in different examples for the purposes of simplicity and clarity and does not per se indicate the relationship between the various embodiments and/or arrangements discussed. In addition, examples of various specific processes and materials are provided herein but those of ordinary skill in the art will be aware of the disclosure of other processes and/or the use of other materials.

At present, the color film design of the display panel includes BM, red color film, green color film and blue color film. BM is located between adjacent red color film and green color film, adjacent green color film and blue color film, and adjacent red color film and blue color film. The region of the black matrix 122 in the color filter layer 12 is the gap between sub-pixels. Generally, the display panel can be scaled according to the sub-pixel contour to obtain the contour shape and size of the corresponding color film. For example, the display panel can be enlarged according to the sub-pixel contour to obtain the contour shape and size of the color film covering the sub-pixel. In such a scheme, the minimum distance between each edge of the color film and the edge corresponding to the sub-pixel is basically the same. In the conventional GGRB-based COE design structure, red sub-pixels, blue sub-pixels and green sub-pixels are arranged in turn, in which the green sub-pixels in each pixel unit are split into two, and the narrower red sub-pixels and the shorter green sub-pixels are displayed. As shown in FIG. 1, the aperture diffraction formed by BM has the strongest diffraction effect between 10~1000 times of wavelength, and the size of sub-pixels with PPI in the range of 100~600 is just within this range, so this design will lead to abnormal color separation between red sub-pixels and green sub-pixels under ambient light irradiation. Because red sub-pixels are narrower on left and right sides, red light diffraction in macroscopic left and right directions is strong, green sub-pixels are shorter on up and down sides, and green light diffraction in macroscopic up and down directions is strong. At the same time, because of the blocking effect of BM on side light emission, the left-right narrower red sub-pixels will show faster left-right brightness attenuation, and the final product will show obvious left-right bluish. However, the up-down shorter green sub-pixels and the up-down longer red sub-pixels make the brightness of the upper and lower green sub-pixels decay quickly and the red sub-pixels decay slowly, which leads to the product showing up-down pinkish.

In addition, in the process, because the distance between two green sub-pixels is small, the BM linewidth is further compressed, and the black matrix 122 is prone to alignment, residue, peeling and the like.

Figure 2:
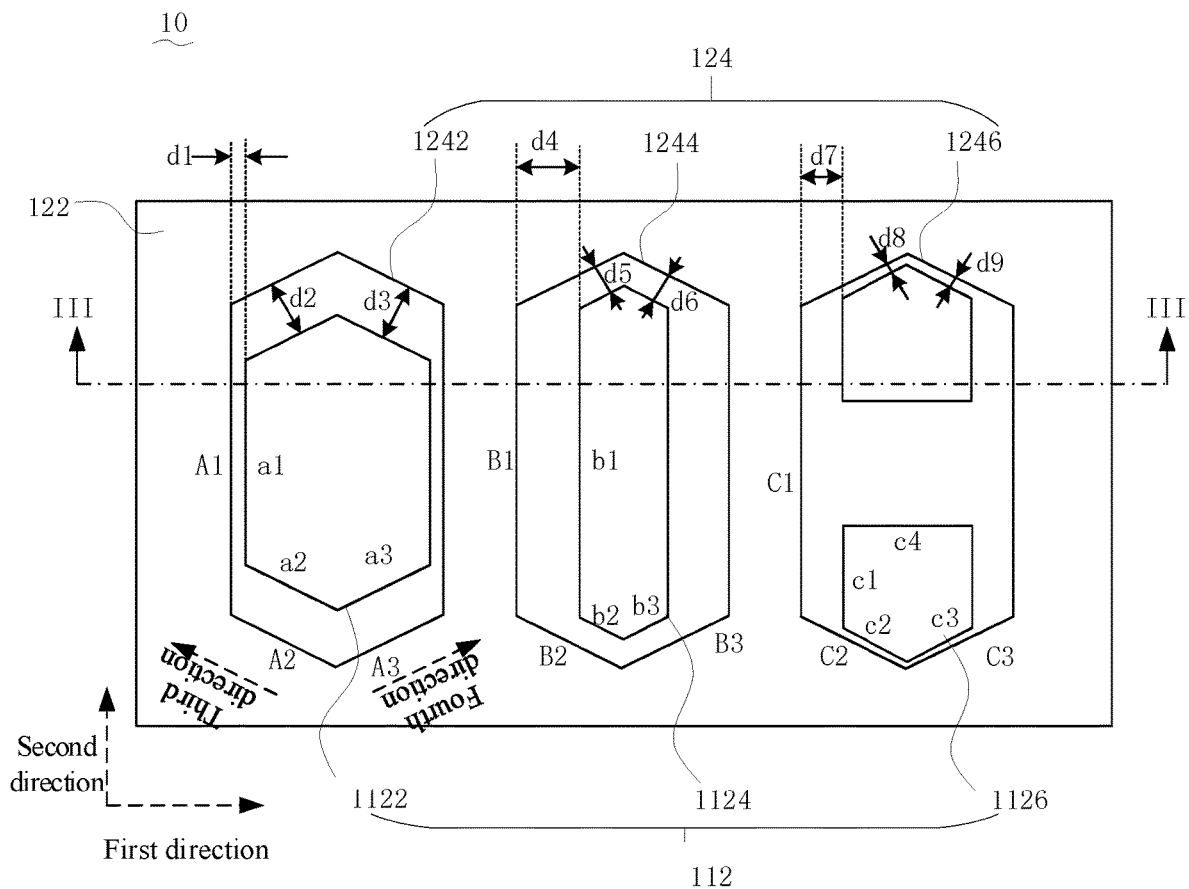
FIG. 2 is a schematic diagram of a structure of a display panel according to an embodiment of the present disclosure.
Figure 3:
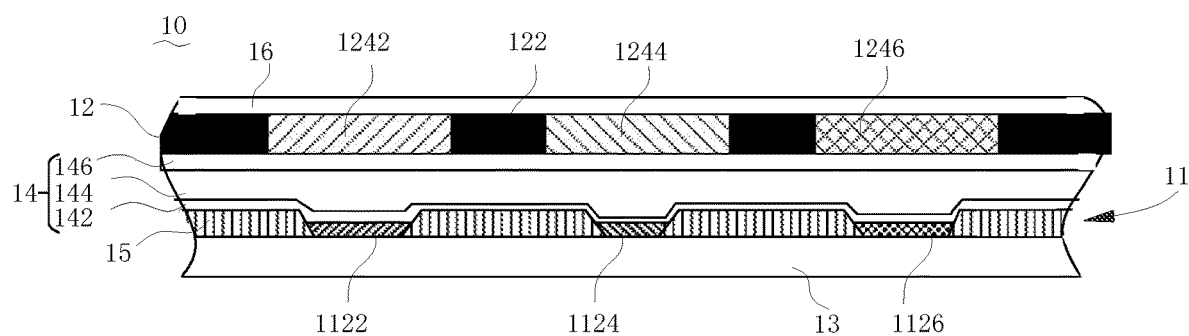
FIG. 3 is a schematic cross-sectional view of the display panel of FIG. 2 in the direction.
Figure 4:
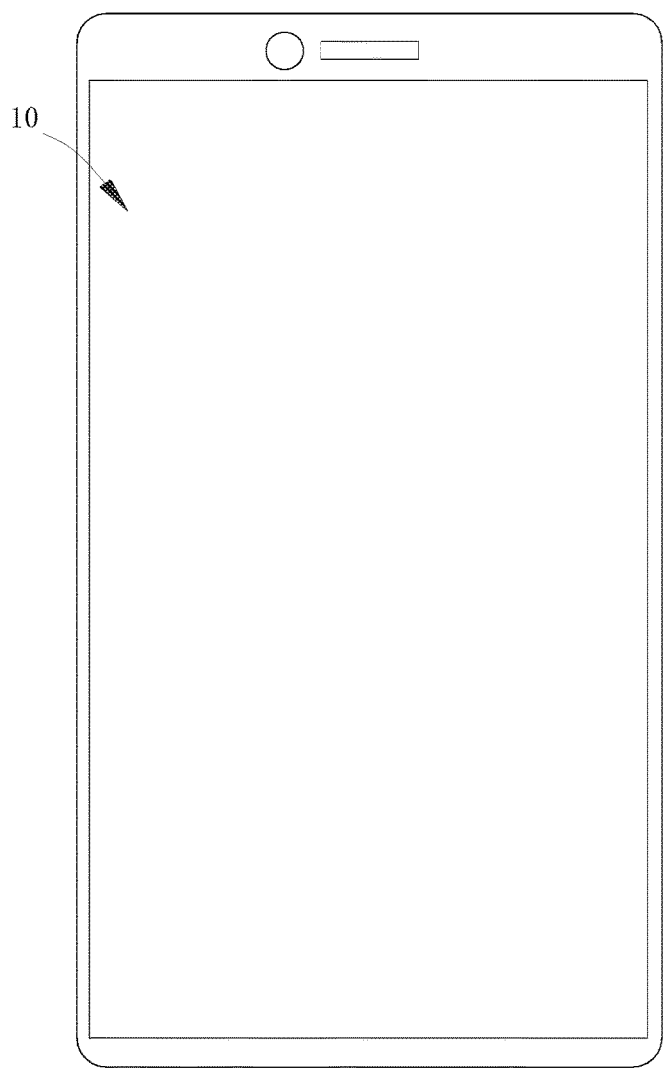
FIG. 4 is a schematic diagram of a structure of a display apparatus according to an embodiment of the present disclosure.

In view of this, with reference to FIGS. 2 and 3, a display panel 10 is provided, which includes a light-emitting device layer 11 and a color filter layer 12 disposed on a light-emitting side of the light-emitting device layer 11. The light-emitting device layer 11 includes a plurality of light-emitting units 112 arranged in an array, each light-emitting unit 112 includes a first sub-pixel 1122, a second sub-pixel 1124 and two third sub-pixels 1126, and the areas of the first sub-pixel 1122, the second sub-pixel 1124 and the third sub-pixel 1126 are different. The color filter layer 12 includes a black matrix 122 and a plurality of color film units 124 corresponding to a plurality of light emitting units 112. Each color film unit 124 includes a first color film 1242, a second color film 1244, and a third color film 1246 that are sequentially arranged in a first direction. The black matrix 122 is located between any two color films of a first color film 1242, a second color film 1244, and a third color film 1246 having the same shape and size. The first color film 1242 corresponds to a first sub-pixel 1122, the second color film 1244 corresponds to a second sub-pixel 1124, and the third color film 1246 corresponds to two third sub-pixels 1126.

In the display panel 10 of the present disclosure, A first color film 1242, a second color film 1244, and a third color film 1246 with basically the same size and shape are arranged corresponding to corresponding sub-pixels. For sub-pixels with different areas, the size of the color film corresponding to each sub-pixel is designed to match with the sub-pixels, so as to improve the reduction of luminescence of each sub-pixel in different directions and reduce the phenomenon of color separation. At the same time, a third sub-pixel 1126 is provided in correspondence to a third color film 1246. Compared with the one-to-one color film scheme, the process difficulty of the black matrix 122 between the color films corresponding to the third sub-pixel 1126 is reduced, and the probability of alignment, residue, peeling and other problems of the black matrix 122 is reduced.

Understandably, the shape and size of the first color film 1242, the second color film 1244 and the third color film 1246 being the same may be that the shape and size of the first color film 1242, the second color film 1244 and the third color film 1246 being completely identical, or that the difference in the shape and size of the first color film 1242, the second color film 1244, and the third color film 1246 is within a preset range, that is, the shape and size of the first color film 1242, the second color film 1244, and the third color film 1246 may have a certain degree of error without affecting the display effect thereof.

The display panel 10 may be an Organic Light-Emitting Diode (OLED) display panel 10. The display panel 10 adopts an organic light emitting diode for display, which can achieve autonomous light emitting and can achieve customized driving for pixel points, can achieve display function without backlight, and has the advantages of light weight, low energy consumption, high brightness, good luminous rate, and the like. The organic light emitting diodes may be arranged on the flexible substrate so that the display panel 10 may be made into a flexible display panel or an anisotropic display panel, etc. In addition, the organic light emitting diodes may be arranged on the light transmitting substrate to improve the light transmitting performance of the display panel 10 or meet other display requirements.

In some embodiments, the light emitting color of the first sub-pixel 1122 is the same as the color of the first color film 1242, the light emitting color of the second sub-pixel 1124 is the same as the color of the second color film 1244, and the light emitting color of the third sub-pixel 1126 is the same as the color of the third color film 1246.

That is, the first color film 1242 can transmit the light emitted by the first sub-pixel 1122 while blocking the passage of light of other colors; the second color film 1244 can transmit light emitted by the second sub-pixel 1124 while blocking the passage of light of other colors; and the third color film 1246 can transmit light emitted by the third sub-pixel 1126 while blocking the passage of light of other colors.

In some embodiments, the first sub-pixel 1122 is a blue sub-pixel, the second sub-pixel 1124 is a red sub-pixel and the third sub-pixel 1126 is a green sub-pixel. Accordingly, the first color film 1242 is a blue color film, the second color film 1244 is a red color film, and the third color film 1246 is a green color film.

Thus, the pixel arrangement structure of the present disclosure is a GGRB structure design, each pixel unit includes a blue sub-pixel, a red sub-pixel and two green sub-pixels, and the blue sub-pixel, the red sub-pixel and the green sub-pixels are arranged in the first direction, so that the light rays of each sub-pixel are mixed and output, thereby achieving color display.

In some embodiments, the transverse dimension of the first sub-pixel 1122 in the first direction is larger than the transverse dimension of the second sub-pixel 1124 in the first direction, and the vertical dimension of the first sub-pixel 1122 in the second direction is smaller than the vertical dimension of the second sub-pixel 1124 in the second direction. Wherein the second direction may be a direction perpendicular to the first direction.

Specifically, the transverse dimension of the blue sub-pixel in the first direction is larger than the transverse dimension of the red sub-pixel in the first direction, and the vertical dimension of the blue sub-pixel in the second direction is smaller than the vertical dimension of the red sub-pixel in the second direction.

It can be understood that the sensitivity of the human eye to different colors is not the same, and setting the sub-pixels of different colors to different sizes can enable the display panel 10 to achieve a display effect adapted to the human eye induction.

In some embodiments, the minimum distance between a side of the first color film 1242 extending along a second direction and a side of the corresponding first sub-pixel 1122 extending along the second direction is smaller than the minimum distance between the sides of the first color film 1242 extending along other directions and the sides of the corresponding first sub-pixel 1122 extending along the directions.

The first color film 1242 includes a first side A1 extending in the second direction, a second side A2 extending in the third direction, and a third side A3 extending in the fourth direction. Accordingly, the first sub-pixel 1122 corresponding to the first color film 1242 includes a first side a1 corresponding to A1 and extending in the second direction, a second side a2 corresponding to A2 and extending in the third direction, and a third side a3 corresponding to A3 and extending in the fourth direction.

Thus, the minimum distance between the side of the first color film 1242 extending in the second direction and the side of the corresponding first sub-pixel 1122 extending in the second direction is the distance d1 between A1 and a1. The minimum distance between the sides of the first color film 1242 extending in the directions and the sides of the corresponding first sub-pixel 1122 extending in other directions is the distance d2 between A2 and a2 and/or the minimum distance d3 between A3 and a3.

Specifically, in some embodiments, the minimum distance between the side of the blue color film extending in the second direction and the side of the corresponding blue sub-pixel extending in the second direction is smaller than the minimum distance between the sides of the blue color film extending in the directions and the sides of the corresponding blue sub-pixel extending in other directions.

Compared with the scheme of obtaining the corresponding color film according to the scaling contour of the sub-pixel, the present disclosure increases the vertical size of the blue color film so as to improve the luminance decay (L-Decay) of the light emitted by the blue sub-pixel corresponding to the second direction, and reduces the transverse size of the blue color film so as to reduce the luminance decay of the light emitted by the blue sub-pixel corresponding to the first direction.

Further, in some embodiments, the ratio of the minimum distance between the side of the first color film 1242 extending in the second direction and the side of the corresponding first sub-pixel 1122 extending in the second direction, and the minimum distance between the sides of the first color film 1242 extending in other directions and the sides of the corresponding first sub-pixel 1122 extending in other directions is 1:3 to 1:2.

That is to say, the ratio of d1 to d2 and/or the ratio of d1 to d3 has a value range of [⅓, ½].

In some embodiments, the minimum distance between the side of the second color film 1244 extending in the second direction and the side of the corresponding second sub-pixel 1124 extending in the second direction is greater than the minimum distance between the sides of the second color film 1244 extending in other directions and the sides of the corresponding second sub-pixel 1124 extending in other directions.

The second color film 1244 includes a first side B1 extending in the second direction, a second side B2 extending in the third direction, and a third side B3 extending in the fourth direction. Accordingly, the second sub-pixel 1124 corresponding to the second color film 1244 includes a first side b1 corresponding to B1 and extending in the second direction, a second side b2 corresponding to B2 and extending in the third direction, and a third side b3 corresponding to B3 and extending in the fourth direction.

Thus, the minimum distance between the side of the second color film 1244 extending in the second direction and the side of the corresponding second sub-pixel 1124 extending in the second direction is the distance d4 between B1 and b1. The minimum distance between the sides of the second color film 1244 extending in other directions and the sides of the corresponding second sub-pixel 1124 extending in other directions is the distance d5 between B2 and b2 and/or the distance d6 between B3 and b3.

Specifically, in some embodiments, a minimum distance between the side of the red color film extending in the second direction and the side of the corresponding red sub-pixel extending in the second direction is greater than a minimum distance between the sides of the red color film extending in other directions and the sides of the corresponding red sub-pixel extending in other directions.

Compared with the scheme of obtaining the corresponding color film according to scaling the contour of the sub-pixel, in the present disclosure, the vertical size of the red color film is reduced, so as to reduce the luminance decay of the light emitted by the red sub-pixel corresponding to the second direction, and the transverse size of the red color film is increased, thereby improving the luminance decay of the light emitted by the red sub-pixel corresponding to the first direction.

Further, in some embodiments, the ratio of the minimum distance between the side of the second color film 1244 extending in the second direction and the side of the corresponding second sub-pixel 1124 extending in the second direction, and the minimum distance between the sides of the second color film 1244 extending in other directions and the sides of the corresponding second sub-pixel 1124 extending in other directions is 3:1 to 4:1.

That is to say, the ratio of d4 to d5 and/or the ratio of d4 to d6 have a value range of [3, 4].

In some embodiments, the minimum distance between the side of the third color film 1246 extending in the second direction and the side of the corresponding third sub-pixel 1126 extending in the second direction is greater than the minimum distance between the sides of the third color film 1246 extending in other directions and the sides of the corresponding third sub-pixel 1126 extending in other directions.

The third color film 1246 includes a first side C1 extending in the second direction, a second side C2 extending in the third direction, and a third side C3 extending in the fourth direction. Accordingly, the third sub-pixel 1126 corresponding to the third color film 1246 includes a first side c1 corresponding to C1 and extending in the second direction, a second side c2 corresponding to C2 and extending in the third direction, a third side c3 corresponding to C3 and extending in the fourth direction, and a fourth side c4 extending in the first direction.

Thus, the minimum distance between the side of the third color film 1246 extending in the second direction and the side of the corresponding third sub-pixel 1126 extending in the second direction is the distance d7 between C1 and c1. The minimum distance between the sides of the third color film 1246 extending in other directions and the sides of the corresponding second sub-pixel 1124 extending in other directions is the distance d8 between C2 and c2 and/or the distance d9 between C3 and c3.

Specifically, in some embodiments, a minimum distance between the side of the green color film extending in the second direction and the side of the corresponding green sub-pixel extending in the second direction is greater than a minimum distance between the sides of the green color film extending in other directions and the sides of the corresponding green sub-pixel extending in the other direction.

Compared with the scheme of obtaining the corresponding color film according to scaling the contour of sub-pixels, in the present disclosure, a green color film is corresponding to two green sub-pixels, the color films corresponding to the two green sub-pixels are connected through, the transverse dimensions of the two green color films along the first direction are reduced appropriately, and the luminance decay of light emitted by the green sub-pixels corresponding to the second direction is improved.

Further, in some embodiments, the ratio of the minimum distance between the side of the third color film 1246 extending in the second direction and the side of the corresponding third sub-pixel 1126 extending in the second direction, and the minimum distance between the sides of the third color film 1246 extending in other directions and the sides of the corresponding third sub-pixel 1126 extending in other directions is 1.5:1 to 2.5:1.

That is to say, the ratio of d7 to d8 and/or the ratio of d7 to d9 has a value range of [1.5, 2.5].

In the present disclosure, the vertical size of the red color film is reduced, the vertical size of the blue color film is increased, the transverse size of blue color film is reduced and the transverse size of red color film is increased. At the same time, the color films corresponding to the two green sub-pixels are connected through, and the transverse dimensions of the color films corresponding to the two green sub-pixels are appropriately reduced, so that the sizes and shapes of the first color films 1242, the second color films 1244 and the third color films 1246 are basically the same. At the same time, the luminance decay of the light emitted by each sub-pixel in all directions is matched, and the diffraction light of different colors is adjusted, so that the color shift in all directions is improved.

In one example, the display panel 10 according to the embodiment of the present disclosure is compared with the conventional technology in which the color filter and the sub-pixel profile are correspondingly set, and the color separation results obtained by measuring based on the CIE1976-Lab standard are shown in the following table:

|     | Conventional design | The present disclosure |
| --- | --- | --- |
| a   | 17  | 8   |
| b   | −25 | −12 |
| lab | 29  | 14  |

The display panel 10 of the embodiment of the present disclosure may have a small color separation which is beneficial to improve the color shift of the product.

In some embodiments, the central connecting line of the two third sub-pixels 1126 is perpendicular to the first direction.

At this time, after communication, the third color film 1246 may be disposed in the same direction as the first color film 1242 and the second color film 1244.

In certain embodiments, the blue sub-pixels are hexagonal, the red sub-pixels are hexagonal, and the green sub-pixels are pentagonal.

Of course, in other embodiments, the shapes of each sub-pixel are not limited to the above-discussed embodiments, and shapes such as a triangle, quadrilateral, octagon, ellipse and the like may be selected according to actual needs and are not specifically limited herein.

In some embodiments, the display panel 10 includes a switching device layer 13 located on a side of the light emitting device layer 11 away from the color film layer 12.

It can be understood that, the switching device layer 13 can be used to control the light emitting device layer 11 to emit light, and in particular, the switching device layer 13 includes a Thin Film Transistor (TFT) with which high responsiveness, high brightness and high contrast display of the organic light emitting diode can be achieved, and the display effect of the display panel 10 can be improved.

In some embodiments, the display panel 10 includes an encapsulation layer 14 positioned between the light emitting device layer 11 and the color filter layer 12.

Thus, the encapsulation layer 14 encapsulates the light emitting device layer 11 and separates the color filter layer 12 from the light emitting device layer 11, so as to avoid the influence of the color filter layer 12 on the light emitting device layer 11.

It should be noted that, the color filter layer 12 may be directly formed on the encapsulation layer 14, or the color filter layer 12 may be formed on a color film substrate, and then the color film substrate on which the color film is formed is bonded to the encapsulation layer 14, which is not specifically limited herein.

Further, in certain embodiments, the encapsulation layer 14 includes a first chemical vapor deposition layer 142, an Ink-Jet Print (UP) layer 144, and a second chemical vapor deposition layer 146 that are sequentially stacked.

In some embodiments, the display panel 10 includes a planarization layer 15 and the device light emitting layer disposed at intervals on a same layer.

In some embodiments, the display panel 10 includes a protection layer 16 located on the side of the color film layer 12 away from the light emitting device layer 11.

The protection layer 16 can protect the display panel 10 from being easily affected by the external environment, reduce damage to the display panel 10 by external forces, and ensure the normal operation of the display panel 10.

The present disclosure further provides a display apparatus 100, which includes the display panel 10 of any one of the foregoing embodiments.

In the display apparatus 100 according to the embodiment of the present disclosure, the display panel 10 includes a first color film 1242, a second color film 1244, and a third color film 1246 having substantially the same size and shape disposed corresponding to corresponding sub-pixels. For sub-pixels with different areas, the size of the color film corresponding to each sub-pixel is designed to match with the sub-pixels, so as to improve the reduction of luminescence of each sub-pixel in different directions and reduce the phenomenon of color separation. At the same time, a third sub-pixel 1126 is provided in correspondence to a third color film 1246. Compared with the one-to-one color film scheme, the process difficulty of the black matrix 122 between the color films corresponding to the third sub-pixel 1126 is reduced, and the probability of alignment, residue, peeling and other problems of the black matrix 122 is reduced.

In some embodiments, the display apparatus 100 may be an electronic apparatus having a display function such as a smart phone, a tablet computer, a laptop computer, a personal data terminal, a smart bracelet, a smart watch and the like. In the illustrated embodiment, the display apparatus 100 is a smart phone.

In the description of the specification, reference terms like "an embodiment", "some embodiments", "schematic embodiment", "an example", "a specific example" or "some examples" intend to indicate that specific features, structures, materials, or characteristics described in connection with the embodiment or example are included in at least one embodiment or example of the present disclosure. In this description, the illustrative description of the above terms is not necessarily directed to the same embodiment or example. Moreover, the specific features, structures, materials, or characteristics described may be combined in any one or more embodiments or examples in a proper way.

Although the specific embodiments of the present disclosure have been illustrated and described, those of ordinary skill in the art will understand that various changes, modifications, substitutions and variations can be made to these embodiments without departing from the principles and concept of the present disclosure. The scope of the present disclosure is defined by the claims and their equivalents.

The invention claimed is:

1. A display panel, comprising:
a light emitting device layer comprising a plurality of light emitting units arranged in an array, wherein each light emitting unit comprises a first sub-pixel, a second sub-pixel and two third sub-pixels, the first sub-pixel, the second sub-pixel and the third sub-pixel have different sizes and shapes; and
a color filter layer arranged on a light emitting side of the light emitting device layer, wherein the color filter layer comprises a black matrix and a plurality of color film units corresponding to the plurality of light emitting units, each of the color film units includes a first color film, a second color film and a third color film arranged in a first direction, the black matrix is located between any two color films of the first color film, the second color film and the third color film, the first color film, the second color film and the third color film have the same shape and size, the first color film is corresponding to the first sub-pixel, the second color film is corresponding to the second sub-pixel, and the third color film is corresponding to the two of the third sub-pixels.

2. The display panel according to claim 1, wherein a minimum distance between a side of the first color film extending along a second direction and a side of the corresponding first sub-pixel extending along the second direction is smaller than a minimum distance between sides of the first color film extending along other directions and sides of the corresponding first sub-pixel extending along the other directions.

3. The display panel according to claim 2, wherein a ratio of the minimum distance between the side of the first color film extending along the second direction and the side of the corresponding first sub-pixel extending along the second direction and the minimum distance between the sides of the first color film extending along the other directions and the sides of the corresponding first sub-pixel extending along the other directions is 1:3 to 1:2.

4. The display panel according to claim 1, wherein a minimum distance between a side of the second color film extending along a second direction and a side of the corresponding second sub-pixel extending along the second direction is larger than a minimum distance between sides of the second color film extending along other directions and sides of the corresponding second sub-pixel extending along the other directions.

5. The display panel according to claim 4, wherein a ratio of the minimum distance between the side of the second color film extending along the second direction and the side of the corresponding second sub-pixel extending along the second direction and the minimum distance between the sides of the second color film extending along the other directions and the sides of the corresponding second sub-pixel extending along the other directions is 3:1 to 4:1.

6. The display panel according to claim 1, wherein a minimum distance between a side of the third color film extending along a second direction and a side of the corresponding third sub-pixel extending along the second direction is larger than a minimum distance between sides of the third color film extending along other directions and sides of the corresponding third sub-pixel extending along the other directions.

7. The display panel according to claim 6, wherein a ratio of the minimum distance between the side of the third color film extending along the second direction and the side of the corresponding third sub-pixel extending along the second direction and the minimum distance between the sides of the third color film extending along the other directions and the sides of the corresponding third sub-pixel extending along the other directions is 1.5:1 to 2.5:1.

8. The display panel according to claim 1, wherein a light emitting color of the first sub-pixel is the same as a color of the first color film, a light emitting color of the second sub-pixel is the same as a color of the second color film, and a light emitting color of the third sub-pixel is the same as a color of the third color film.

9. The display panel according to claim 1, wherein the first sub-pixel is a blue sub-pixel, the second sub-pixel is a red sub-pixel, and the third sub-pixel is a green sub-pixel.

10. The display panel according to claim 9, wherein a transverse dimension of the blue sub-pixel in a first direction is larger than a transverse dimension of the red sub-pixel in the first direction.

11. The display panel according to claim 9, wherein a connecting line connecting centers of the two third sub-pixels is perpendicular to a first direction.

12. The display panel according to claim 9, wherein the blue sub-pixel is in a shape of hexagonal, the red sub-pixel is in a shape of hexagonal, and the green sub-pixel is in a shape of pentagonal.

13. The display panel according to claim 9, wherein a vertical dimension of the blue sub-pixel in a second direction is smaller than a vertical dimension of the red sub-pixel in the second direction.

14. The display panel according to claim 1, wherein the display panel includes a switching device layer located on a side of the light emitting device layer away from the color filter layer.

15. The display panel according to claim 1, wherein the display panel comprises an encapsulation layer located between the light emitting device layer and the color filter layer.

16. The display panel according to claim 1, wherein the display panel includes a protection layer located on a side of the color filter layer away from the light emitting device layer.

17. An electronic apparatus, comprising the display panel according to claim 1.

18. The display panel according to claim 15, wherein the color filter layer is directly formed on the encapsulation layer.

19. The display panel according to claim 15, wherein the color filter layer is formed on a color film substrate, and the color film substrate on which the color filter layer is formed is bonded to the encapsulation layer.

20. The display panel according to claim 15, wherein the encapsulation layer comprises a first chemical vapor deposition layer, an Ink-Jet Print (IJP) layer, and a second chemical vapor deposition layer which are sequentially stacked.

* * * * *